United States Patent [19]

Tan et al.

[11] Patent Number: 5,683,851
[45] Date of Patent: Nov. 4, 1997

[54] POSITIVE PHOTORESIST COMPOSITION

[75] Inventors: Shiro Tan; Shinji Sakaguchi, both of Shizuoka, Japan

[73] Assignee: Fuji Photo Film Co., Ltd., Kanagawa, Japan

[21] Appl. No.: 784,469

[22] Filed: Jan. 17, 1997

[30] Foreign Application Priority Data

Jan. 22, 1996 [JP] Japan ................................. 8-008388

[51] Int. Cl.$^6$ ............................................. G03F 7/023
[52] U.S. Cl. ........................ 430/191; 430/165; 430/192; 430/193
[58] Field of Search ............................. 430/165, 191, 430/192, 193

[56] References Cited

U.S. PATENT DOCUMENTS

| | | | |
|---|---|---|---|
| 4,424,315 | 1/1984 | Taylor et al. | 430/192 |
| 4,551,409 | 11/1985 | Gulla et al. | 430/192 |
| 5,110,706 | 5/1992 | Yumoto et al. | 430/191 |
| 5,225,311 | 7/1993 | Nakano et al. | 430/193 |
| 5,322,757 | 6/1994 | Ebersole et al. | 430/192 |
| 5,403,696 | 4/1995 | Hioki et al. | 430/192 |
| 5,437,952 | 8/1995 | Hirai et al. | 430/191 |
| 5,460,917 | 10/1995 | Kobayashi et al. | 430/191 |

*Primary Examiner*—John S. Chu
*Attorney, Agent, or Firm*—Sughrue, Mion, Zinn, Macpeak & Seas, PLLC

[57] ABSTRACT

Provided is a positive photoresist composition comprising (A) an alkali-soluble resin prepared by condensation of aldehydes and a mixture of phenols, which comprises (i) thymol, isothymol or a thymol-isothymol mixture and (ii) one or more of a phenol compound represented by the following formula (I);

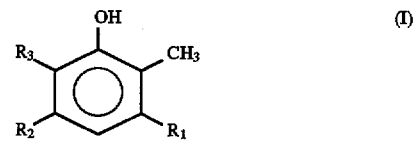

wherein $R_1$, $R_2$ and $R_3$ are the same or different, and each of them represents a hydrogen atom or a methyl group, and optionally, as a third monomer, (iii) a phenol compound other than m-cresol; (B) 1,2-naphthoquinonediazide-5-(and/or -4-)sulfonic acid esters as photosensitive agent; and (C) a low molecular weight compound having from 12 to 50 carbon atoms in all and from 2 to 8 phenolic hydroxy groups.

12 Claims, No Drawings

POSITIVE PHOTORESIST COMPOSITION

FIELD OF THE INVENTION

The present invention relates to a positive photoresist composition comprising a particular alkali-soluble novolak resin, a 1,2-quinonediazide compound and a specified low molecular weight compound as an additive, which is responsive to radiations such as ultraviolet rays, deep ultraviolet rays, X-rays, electron beams, molecular beams, γ-rays or cyclotron radiation. In further detail, the invention is concerned with a positive photoresist composition for microlithography which has not only wide development latitude and high sensitivity but also satisfactory resolution, defocus latitude and heat resistance.

The present photoresist composition is typically utilized in the filed of production of semiconductor devices, such as IC, and circuit substrates for liquid crystals, thermal heads and the like, and in other photofabrication processes.

BACKGROUND OF THE INVENTION

A generally used positive photoresist composition comprises an alkali-soluble resin and a naphthoquinonediazide compound as a photosensitive material. As for the combination of these constituents, the combinations of novolak-type phenol resins with naphthoquinonediazido-substituted compounds are disclosed, e.g., in U.S. Pat. Nos. 3,666,473, 4,115,128 and 4,173,470, and the combinations of novolak resins prepared from cresols and formaldehyde with trihydroxybenzophenone-1,2-naphthoquinonediazide sulfonic acid esters are described as most typical compositions in L. F. Thompson, *Introduction to Microlithography*, No. 219, pp. 112–121, ACS publisher.

Novolak resins used as binder are particularly useful for the present purposes, because they are soluble in aqueous alkali solutions without swelling therein and can provide high resistance to etching, especially to plasma etching, when the images formed therefrom are used as etching mask. In addition, naphthoquinonediazide compounds used as photosensitive material are unique in having a property that the compounds themselves function as dissolution inhibitor to lower the solubility of a novolak resin in alkali, but on the other hand they decompose upon irradiation with light to produce alkali-soluble substances, thereby rather promoting the dissolution of a novolak resin in alkali. Owing to such a great change caused in property by light, naphthoquinonediazide compounds are particularly favorable for the use as photosensitive materials of positive photoresist compositions.

From the aforementioned points of view, a large number of positive photoresist compositions which each comprise a novolak resin and a naphthoquinonediazide photosensitive material have hitherto been developed and put to practical use. In the processing of lines having a width of the order of 1 μm at the thinnest, those compositions have accomplished satisfactory results.

With respect to integrated circuits, on the other hand, the integration degree thereof has become higher and higher in recent years. Thus, processing of super fine patterns having a line width of 1 μm or below, further 0.5 μm or below, has come to be required in the production of semiconductor substrates for VLSI and the like. In such uses, photoresist is required to have very high resolution, wide defocus latitude, highly precise reproducibility of pattern shape by which exact copying of the shape of an exposure mask is enabled, and wide development latitude enough to ensure a consistent line width upon processing. In order to achieve high productivity, it is further required for the photoresist to have high sensitivity. Moreover, the resist is required to have high heat resistance. This is because dry etching processes are supplanting the conventional wet etching processes for the purpose of heightening the integration degree of integrated circuits, and the dry etching processes tend to cause thermal deformation in resist since they involve a rise of the resist temperature.

Hitherto, the use of resist having a high γ value has been considered to be advantageous for heightening resolution and reproducing an image of desirable pattern shape, so that resist-composition arts capable of answering such a purpose have been developed. Thus, there are known a large number of patents and reports disclosing such arts. In particular, many applications have been made for patents with respect to the art of novolak resins as a main component of positive photoresist, including their monomer compositions, molecular weight distributions and syntheses methods, and those patents have accomplished certain results. However, the drawback of being low in sensitivity is common to most of such high resolution resists. As the art of heightening the sensitivity, on the other hand, the addition of low molecular weight compounds having alkali-soluble groups as dissolution accelerator is disclosed, but on the contrary the addition of such compounds often brings about the problems of narrowing the development latitude, lowering the heat resistance and so on. Further, many of those compounds have disadvantages of impairing the pattern shape and so on.

Thus, it is desired to discover resists having not only wide development latitude but also high sensitivity and satisfactory resolution, defocus latitude and heat resistance. The term "development latitude" as used herein can be defined as the dependence of a line width of the developed resist upon the development time or the development temperature. The term "defocus latitude" as used herein can be expressed in terms of the change caused in a resist line width by a shift of the position on which the focus is taken, or in terms of the focus range in which the resolution of a line pattern is ensured in the developed resist without a decrease in film thickness.

With the intention of improving the foregoing characteristics, a wide variety of investigations have been undertaken.

More specifically, numerous novolak resins using cresols as monomer species have so far been disclosed, e.g., in JP-A-58-17112 (The term "JP-A" as used herein means an "unexamined published Japanese patent application"), JP-A-60-57339, JP-A-62-14148, JP-A-62-35347 and JP-A-62-35349. In the formation of a super fine pattern, however, those novolak resins cannot ensure sufficient resolution and defocus latitude, so that they are not wholly satisfactory.

Further, numbers of novolak resins using monomer species other than cresols have been proposed with the intention of making improvements in resolution, heat resistance, profile and so on. For instance, the novolak resins comprising xylenols or trimethylphenols as monomer species are disclosed, e.g., in JP-A-60-17603, JP-A-60-164740, and JP-A-64-50044 and International Patent Application JP-W-5-500274. However, the use of those arts also cannot provide very satisfactory resolution, sensitivity and defocus latitude.

Furthermore, the novolak resin comprising m-cresol as an essential component and also 2-methyl-4-isopropylphenol as another monomer species is disclosed in JP-A-62-260146, but it has a drawback of being insufficient in resolution because the use of trifunctional m-cresol broadens the molecular weight distribution. In addition, U.S. Pat. No. 4,551,409 discloses 2-isopropyl-5-methylphenol (thymol) and 5-isopropyl-2-methylphenol (carvacrol) as monomers undergoing copolymerization together with naphthols. The resultant novolak resins are inferior in sensitivity and resolution, so that improvements upon them are requested.

Also, attempts to improve upon resist characteristics by giving a special molecular weight distribution to a novolak resin have already been made. For instance, JP-A-1-105243 describes as desirable novolak resins those having a molecular weight distribution such that the proportion of resin molecules having their molecular weight in the range of 500 to 5,000 is not more than 30%. In addition, it is shown in JP-A-62-227114 and JP-A-63-2044 that there are desirable limits to the proportion of resin molecules having their molecular weight in a particular region of the molecular weight distribution. Further, the novolak resins free from low molecular weight components by having undergone fractionation treatment are described in JP-A-60-97347 and JP-A-60-189739, and the use of resins having a Mw/Mn ratio of no greater than 3 (Mw: weight-average molecular weight; Mn: number-average molecular weight) are described in JP-A-60-45238, JP-A-3-208054, JP-A-5-142770, JP-A-60-140235 and so on.

On the other hand, low molecular weight compounds containing aromatic hydroxyl groups are generally used as dissolution accelerator for the purpose of heightening the sensitivity and so on. The addition of such compounds to resist compositions is disclosed in many references. For example, JP-A-61-141441 discloses the positive photoresist composition in which trihydroxybenzophenone is present. The addition of trihydroxybenzophenone can bring about improvements upon the sensitivity and developability of a positive working photoresist, but the heat resistance and the profile are deteriorated thereby.

As measures to heighten the sensitivity without deterioration of heat resistance, the addition of aromatic polyhydroxy compounds other than trihydroxybenzophenone is presented in JP-A-64-44439, JP-A-1-177032, JP-A-1-280748, JP-A-2-10350, JP-A-3-200251, JP-A-3-191351, JP-A-3-200255, JP-A-4-299348 and JP-A-5-204144.

However, such compounds added have a common disadvantage of causing an increase in reduction of the film thickness in unexposed areas to result in deterioration of resist pattern shape. Further, they generally narrow the development latitude since they function so as to increase the development speed. Therefore, structures appropriate for aromatic polyhydroxy compounds have been chosen with consideration for the minimum of such disadvantages.

SUMMARY OF THE INVENTION

Therefore, an object of the present invention is to provide a positive photoresist composition which can ensure a particularly wide development latitude and high heat resistance as it retains high resolution and a wide defocus latitude, and that without loss of sensitivity.

As a result of our intensive studies with consideration for the aforementioned characteristics, it has been found that it is important to choose a novolak resin prepared from specified species of monomers (phenols) and to mix the novolak resin with a specified phenolic compound and a specified photosensitive agent in their appropriate ranges of proportions.

More specifically, the object of the present invention is attained by a positive photoresist composition (1) or (2): with the composition (1) comprising;

(A) 100 parts by weight of an alkali-soluble resin prepared by condensation of aldehydes and a phenol compound mixture comprising (i) thymol, isothymol or a thymol-isothymol mixture, and (ii) one or more of a phenol compound represented by the following formula (I),

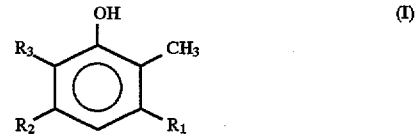

wherein $R_1$, $R_2$ and $R_3$ are the same or different, and each of them represents a hydrogen atom or a methyl group, and optionally, as a third monomer, (iii) a phenol compound other than m-cresol, (B) from 30 to less than 130 parts by weight of 1,2-naphthoquinonediazide-5-(and/or -4-)sulfonic acid esters as photosensitive agent, and (C) from 20 to less than 60 parts by weight of a low molecular weight compound which contains from 12 to 50 carbon atoms in all and has from 2 to 8 phenolic hydroxy groups:

and with the composition (2) comprising;

(A) 100 parts by weight of an alkali-soluble resin prepared by condensation of aldehydes and a phenol compound mixture comprising (i) thymol, isothymol or a thymol-isothymol mixture, (ii) one or more of a phenol compound represented by the foregoing formula (I), and (iii) at least one compound selected from the group consisting of p-cresol, 3,4-xylenol and phenol compounds represented by the following formula (II),

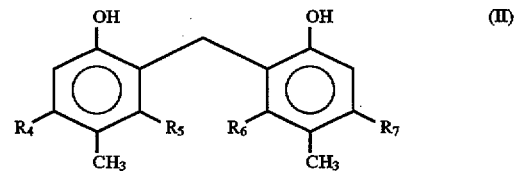

wherein $R_4$, $R_5$, $R_6$ and $R_7$ are the same or different, and each of them represents a hydrogen atom or a methyl group, (B) from 30 to less than 130 parts by weight of 1,2-naphthoquinonediazide-5-(and/or -4-)sulfonic acid esters as photosensitive agent, and (C) from 20 to less than 60 parts by weight of a low molecular weight compound which contains from 12 to 50 carbon atoms in all and has from 2 to 8 phenolic hydroxy groups.

DETAILED DESCRIPTION OF THE INVENTION

The effects of the present invention are special effects which can be achieved only by using a novolak resin having a particular monomer constitution and adding thereto a low molecular weight compound as defined above in the prescribed amount.

More specifically, much to our surprise, the combination of such a low molecular weight compound with the novolak resin specified in the present invention provides a much wider development latitude than the independent use of the low molecular weight compound or the novolak resin:

while, as expected, it heightens the sensitivity of the resultant photoresist due to the dissolution accelerating effect of the low molecular weight compound.

Although reasons why the specific effect as described above can be produced are not yet clarified, the greatest contribution to such an effect is supposed to be made by special constituent monomers of the novolak resin, namely thymol and/or isothymol which has methyl or isopropyl groups at the 2- and 5-positions (with the proviso that an isopropyl group is present at least either of the two positions) and a specified monomer represented by formula (I) illustrated above. At any rate, the combination of the present novolak resin, a definite amount of photosensitive agent and a specified dissolution accelerator can produce unexpected effects upon improvements in resolution, defocus latitude, development latitude and heat resistance. These effects cannot be anticipated from individual effects of each conventionally known component or additive effects of all the conventionally known components. Thus, this finding leads to the present invention.

In the reaction of phenol compounds with aldehydes, the o- and p-positions to a phenolic hydroxy group function as active sites. Accordingly, a phenol compound having 3 active sites, such as m-cresol, is defined as a trifunctional monomer; while a phenol compound substituted at one of the o- and p-positions is defined as a bifunctional monomer, and a phenol compound substituted at two of the o- and p-positions is defined as a monofunctional monomer.

The desirable embodiments of the present invention are illustrated below in detail.

In the first place, favorable combinations of phenol compounds for fully achieving the effects of the present invention are described.

The first monomer in the present invention is thymol (2-isopropyl-5-methylphenol), isothymol (5-isopropyl-2-methylphenol, or carvacrol), or a mixture thereof.

The proportion of the first monomer to the total monomers used in the present invention is from 10 to 70 mole preferably from 10 to 40 mole %, and more preferably from 10 to 30 mole %.

The second monomer in the present invention is a phenol compound represented by the foregoing formula (I), with specific examples including o-cresol, 2,3-xylenol, 2,5-xylenol, 2,6-xylenol, 2,3,5-trimethylphenol, 2,3,6-trimethylphenol and 2,3,5,6-tetramethylphenol. Of these compounds, o-cresol, 2,3-xylenol, 2,5-xylenol, 2,6-xylenol and 2,3,5-trimethylphenol are preferred over the others.

The compounds recited above as the second monomer can be used individually, or as a mixture of two or more thereof. The preferred proportions of monomers in a mixture suitable for the second monomer are as follows:

(a) 2,6-xylenol; 2–25 mole %, (b) o-cresol; 0.1–25 mole %, (c) 2,3-xylenol and/or 2,5-xylenol; 40–80 mole % and (d) 2,3,5-trimethylphenol; no more than 20 mole %.

By mixing those monomers in the proportions set forth above, the effects of the present invention are enhanced.

The proportion of the second monomer to the total monomers used is from 30 to 90 mole %, preferably from 60 to 90 mole %, and more preferably from 70 to 90 mole %.

In addition to the aforementioned first and second monomers, the third monomer can be used in the present invention. The third monomer is a phenol compound other than m-cresol, and preferably a monofunctional or bifunctional phenol compound. It is particularly desirable for the third monomer to be at least one compound selected from the group consisting of p-cresol, 3,4-xylenol and phenol compounds represented by the foregoing formula (II). The presence of the third monomer is favorable, because it can further broaden the defocus latitude.

As for the compound represented by the foregoing formula (II), 2,2'-dihydroxy-5,5'-dimethyldiphenylmethane and 2,2'-dihydroxy-4,4',5,5'-tetramethyldiphenylmethane are examples thereof. Of such compounds, 2,2'-dihydroxy-5,5'-dimethyldiphenylmethane is preferred over the others.

The proportion of the third monomer to the total phenol monomers used is in the range of 0.2 to 20 mole %.

As the third monomer other than the first and second monomers, phenol compounds different from those recited above as desirable third monomer can also be used in the production of the present novolak resin. However, trifunctional monomers, such as m-cresol, are unsuitable for the third monomer, because the molecular weight distribution of the resultant novolak resin is broadened to lower the resolution.

Examples of a phenol compound which can be used as another third monomer include o-methoxyphenol, o-ethylphenol, p-ethylphenol, 2-methoxy-4-methylphenol, o-propoxyphenol, p-propoxyphenol, o-butoxyphenol, p-butoxyphenol, 3,4,5-trimethylphenol, o-vinylphenol, p-vinylphenol, o-allylphenol, p-allylphenol, o-phenylphenol, p-phenylphenol, o-benzylphenol, p-benzylphenol, o-methoxycarbonylphenol, p-methoxycarbonylphenol, o-benzoyloxyphenol, p-benzoyloxyphenol, o-chlorophenol, p-chlorophenol, o-cyclohexylphenol, p-cyclohexylphenol, 3-methyl-6-cyclohexylphenol, and polyhydroxybenzenes.

Examples of aldehydes usable therein include formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, vanillin, o-vanillin, iso-vanillin, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, chloroacetaldehyde, and acetals thereof, such as chloroacetaldehyde diethylacetal. Of these aldehydes, however, formaldehyde is preferred as a main aldehyde used in the present invention.

Those aldehydes may be used alone or as combination of two or more thereof.

As for the acid catalyst which can be used in the foregoing condensation reaction, hydrochloric acid, sulfuric acid, formic acid, acetic acid, p-toluenesulfonic acid, methanesulfonic acid, malonic acid, mercaptoacetic acid and oxalic acid are examples thereof. These acids may also be used as a mixture of two or more thereof.

The ratio of aldehydes to the aforementioned mixture of phenol compounds (aldehydes/phenol mixture ratio) is preferably from 0.4 to 1.5 by mole, and more preferably from 0.5 to 1.3 by mole.

The molecular weight distribution suitable for heightening the effects of the present invention is described below.

It is desirable for the novolak resin used in the present composition to have a relatively narrow distribution of molecular weights. The spread of a molecular weight distribution among polymer molecules is known to be generally expressed in terms of the ratio of a weight-average molecular weight (Mw) to a number-average molecular weight (Mn), or the Mw/Mn ratio (herein named dispersion degree). The numerical value of dispersion degree becomes greater the more widely the molecular weights are distributed. When polymer molecules have no distribution with respect to their weights, the ratio takes a value of 1. Novolak resins which have so far been used for typical positive photoresist are relatively wide in molecular weight distribution. As representatively shown in JP-A-62-172341, many of those novolak resins have their dispersion degrees in the range of 5 to 10. Further, SPIE Proceeding "*Advances in Resist Technology and Processing* V", vol. 920, p. 349, suggests that a novolak resin having a dispersion degree ranging from 4.55 to 6.75 provides a higher γ value than a novolak resin having a dispersion degree of 3.0.

By contrast with the foregoing suggestion, it is desirable for novolak resins relating to the present invention to have a dispersion degree ranging from 1.5 to 4.0, preferably from 1.7 to 3.5. When the dispersion degree is too high, the effects intended by the present invention, including high resolution, wide defocus latitude and wide development latitude, cannot be accomplished. When the dispersion degree is too low, on the other hand, the synthesis of such novolak resins requires a high level of purification step, and so it is unsuitable from a practical point of view.

It is desirable for the present novolak resin to have a weight-average molecular weight (Mw) ranging from 2,000 to 20,000, more preferably from 2,300 to 7,000. When the value of Mw is too great, similarly to the above, the effects which the present invention aims for, including high resolution, wide defocus latitude and wide development latitude, cannot be obtained.

Additionally, the term "weight-average molecular weight" as used herein refers to the value determined by gel permeation chromatography (which is abbreviated as GPC, hereinafter) wherein the standard polystyrene is employed as a reference resin.

In producing novolak resins having such a low dispersion degree as preferred in the present invention, it can be thought of adopting various methods.

For instance, such resins can be obtained using the methods described in JP-A-60-189739, JP-A-60-140235, JP-A-64-14229, JP-A-1-105243, JP-A-2-60915, JP-A-4-122938, JP-A-4-101147, JP-A-4-251257, JP-A-4-296755, U.S. Pat. No. 4,795,829, U.S. Pat. No. 5,151,339 and so on, namely the method of selecting special phenolic monomers, the method of choosing a proper condition for the condensation reaction, the method of subjecting a conventional novolak resin, which is high in dispersion degree, to fractional precipitation, and so on. Any of these methods may be used for producing a novolak resin which can ensure the effects intended by the present invention.

The condensation reaction of the aforementioned mixture of phenol compounds with aldehydes can be effected generally by heating those reactants for 2–24 hours in the presence of an acid catalyst with or without a proper solvent to yield a novolak resin used in the present invention.

As for the photosensitive agent used in the present invention, the products of esterification reaction between 1,2-naphthoquinonediazide-5-(and/or -4-)sulfonyl chloride and polyhydroxy compounds as recited below are examples thereof.

As examples of polyhydroxy compounds which can be used in the foregoing esterification reaction, mention may be made of:

bis((poly)hydroxyphenyl)alkanes, such as bis(2,4-dihydroxyphenyl)methane, bis(2,3,4-trihydroxyphenyl)methane, bis(2,4-dihydroxyphenyl) propane-1, bis(2,3,4-trihydroxyphenyl)propane-1, nordihydroguaiaretic acid and 1,1-bis(4-hydroxyphenyl)cyclohexane;

polyhydroxybenzoic acid esters, such as 3,4,5-trihydroxybenzoic acid propylester, 2,3,4-trihydroxybenzoic acid phenylester and 3,4,5-trihydroxybenzoic acid phenylester;

bis(polyhydroxybenzoyl)alkanes and bis(polyhydroxybenzoyl)benzenes, such as bis(2,3,4-trihydroxybenzoyl)methane, bis(3-acetyl-4,5,6-trihydroxyphenyl)methane, bis(2,3,4-trihydroxybenzoyl)benzene and bis(2,4,6-trihydroxybenzoyl)benzene;

alkylene-di(polyhydroxybenzoate)'s, such as ethyleneglycol-di(3,5-dihydroxybenzoate) and ethyleneglycol-di(3,4,5-trihydroxybenzoate);

polyhydroxybiphenyls, such as 2,3,4-trihydroxybiphenyl, 3,4,5-trihydroxybiphenyl, 3,5,3',5'-tetrahydroxybiphenyl, 2,4,2',4'-tetrahydroxybiphenyl, 2,4,6,3',5'-pentahydroxybiphenyl, 2,4,6,2',4',6'-hexahydroxybiphenyl and 2,3,4,2',3',4'-hexahydroxybiphenyl;

bis(polyhydroxy)sulfides, such as 4,4'-thiobis(1,3-dihydroxy)benzene;

bis(polyhydroxyphenyl)ethers, such as 2,2',4,4'-tetrahydroxydiphenyl ether;

bis(polyhydroxyphenyl)sulfoxides, such as 2,2',4,4'-tetrahydroxydiphenyl sulfoxide;

bis(polyhydroxyphenyl)sulfones, such as 2,2',4,4'-diphenylsulfone;

polyhydroxytriphenylmethanes, such as tris(4-hydroxyphenyl)methane, 4,4',4"-trihydroxy-3,5,3',5'-tetramethyltriphenylmethane, 4,4',3",4"-tetrahydroxy-3,5,3',5'-tetramethyltriphenylmethane, 4-[bis(3,5-dimethyl-4-hydroxyphenyl)methyl]-2-methoxyphenol, 4,4'-(3,4-diol-benzilidene)bis[2,6-dimethylphenol], 4,4'-[(2-hydroxyphenyl)methylene]bis[2-cyclohexyl-5-methylphenol], 4,4',2",3",4"-pentahydroxy-3,5,3',5'-tetramethyltriphenylmethane, 2,3,4,2',3',4'-hexahydroxy-5,5'-diacetyltriphenylmethane, 2,3,4,2',3',4',3",4"-octahydroxy-5,5'-diacetyltriphenylmethane and 2,4,6,2',4',6'-hexahydroxy-5,5'-dipropionyltriphenylmethane;

polyhydroxytriphenylethanes, such as 4,4'-(phenylmethylene)bisphenol, 4,4'-(1-phenylethylidene)bis[2-methylphenol] and 4,4',4"-ethylidene-trisphenol;

polyhydroxyspirobi-indanes, such as 3,3,3',3'-tetramethyl-1,1'-spirobi-indane-5,6,5',6'-tetrol, 3,3,3',3'-tetramethyl-1,1'-spirobi-indane-5,6,7,5',6',7'-hexol, 3,3,3',3'-tetramethyl-1,1'-spirobi-indane-4,5,6,4',5',6'-hexol and 3,3,3',3'-tetramethyl-1,1'-spirobi-indane-4,5,6,5',6',7'-hexol;

polyhydroxyflavans, such as 2,4,4-trimethyl-2',4',7'-trihydroxyflavan;

polyhydroxyphthalides, such as 3,3-bis(3,4-dihydroxyphenyl)phthalide, 3,3-bis(2,3,4-trihydroxyphenyl)phthalide and 3',4'.5',6'-tetrahydroxyspiro[phthalide-3,9'-xanthene];

flavonoid dyes, such as morin, quercetin and rutin;

the polyhydroxy compounds described in JP-A-4-253058, such as α,α',α"-tris(4-hydroxyphenyl) 1,3,5-triisopropylbenzene, α,α',α"-tris(3,5-dimethyl-4-hydroxyphenyl) 1,3,5-triisopropylbenzene, α,α',α"-tris(3,5-diethyl-4-hydroxyphenyl) 1,3,5-triisopropylbenzene, α,α',α"-tris(3,5-di-n-propyl-4-hydroxyphenyl) 1,3,5-triisopropylbenzene, α,α',α"-tris(3,5-diisopropyl-4-hydroxyphenyl) 1,3,5- triisopropylbenzene, α,α',α"-tris(3,5-di-n-butyl-4-hydroxyphenyl) 1,3,5-triisopropylbenzene, α,α',α"-tris(3-methyl-4-hydroxyphenyl) 1,3,5-triisopropylbenzene, α,α',α"-tris(3-methoxy-4-hydroxyphenyl) 1,3,5-triisopropylbenzene, α,α',α"-tris(2,4-dihydroxyphenyl) 1,3,5-triisopropylbenzene, 1,3,5-tris(3,5-dimethyl-4-hydroxyphenyl)benzene, 1,3,5-tris(5-methyl-2-hydroxyphenyl)benzene, 2,4,6-tris(3,5-dimethyl-4-hydroxyphenylthiomethyl)mesitylene, 1-[α-methyl-α-(4'-hydroxyphenyl)ethyl]-4-[α,α'-bis(4"-hydroxyphenyl)ethyl]benzene, 1-[α-methyl-α-(4'-hydroxyphenyl)ethyl]-3-[α,α'-bis(4"-hydroxyphenyl)ethyl]benzene, 1-[α-methyl-α-(3',5'-dimethyl-4'-hydroxyphenyl)ethyl]-4-[α,α'-bis(3",5"-dimethyl-4"-hydroxyphenyl)ethyl]benzene, 1-[α-methyl-α-(3'-methyl-4'-hydroxyphenyl)ethyl]-4-[α',α'-bis(3"-methyl-4"-hydroxyphenyl)ethyl]benzene, 1-[α-methyl-α-(3'-methoxy-4'-hydroxyphenyl)ethyl]-4-[α',α'-bis(3"-methoxy-4"-hydroxyphenyl)ethyl]benzene, 1-[α-methyl-α-(2',4'-dihydroxyphenyl)ethyl]-4-[α',α'-bis(4"-hydroxyphenyl)ethyl]benzene and 1-[α-methyl-α-(2',4'-dihydroxyphenyl)ethyl]-3-[α',α'-bis(4"-hydroxyphenyl)ethyl]benzene;

the polyhydroxy compounds described in JP-A-5-224410, such as α,α,α',α',α",α"-hexakis-(4-hydroxyphenyl)-1,3,5-triethylbenzene;

the poly(hydroxyphenyl)alkanes described in JP-A-5-303200 and European Patent No. 0,530,148, such as 1,2,2,3-tetra(p-hydroxyphenyl)propane and 1,3,3,5-tetra(p-hydroxyphenyl)pentane;

p-bis(2,3,4-trihydroxybenzoyl)benzene, p-bis(2,4,6-trihydroxybenzoyl)benzene, m-bis(2,3,4-trihydroxybenzoyl)benzene, m-bis(2,4,6-trihydroxybenzoyl)benzene, p-bis(2,5-dihydroxy-3-bromobenzoyl)benzene, p-bis(2,3,4-trihydroxy-5-methylbenzoyl)benzene, p-bis(2,3,4-trihydroxy-5-methoxybenzoyl)benzene, p-bis(2,3,4-trihydroxy-5-nitrobenzoyl)benzene, p-bis(2,3,4-trihydroxy-5-cyanobenzoyl)benzene, 1,3,5-tris(2,5-dihydroxybenzoyl)benzene, 1,3,5-tris(2,3,4-trihydroxybenzoyl)benzene, 1,2,3-tris(2,3,4-trihydroxybenzoyl)benzene, 1,2,4-tris(2,3,4-trihydroxybenzoyl)benzene, 1,2,4,5-tetrakis(2,3,4-trihydroxybenzoyl)benzene, α,α'-bis(2,3,4-trihydroxybenzoyl)-p-xylene, α,α',α'-tris(2,3,4-trihydroxybenzoyl)mesitylene, 2,6-bis-(2-hydroxy-3,5-dimethylbenzyl)-p-cresol, 2,6-bis-(2-hydroxy-5'-methyl-benzyl)-p-cresol, 2,6-bis-(2,4,6-trihydroxybenzyl)-p-cresol, 2,6-bis-(2,3,4-trihydroxybenzyl)-p-cresol, 2,6-bis-(2,3,4-trihydroxybenzyl)-3,5-dimethylphenol, 4,6-bis-(4-hydroxy-3,5-dimethylbenzyl)-pyrogallol, 2,6-bis-(4-hydroxy-3,5-dimethylbenzyl)-1,3,4-trihydroxyphenol, 4,6-bis-(2,4,6-trihydoxybenzyl)-2,4-dimethylphenol, 4,6-bis-(2,3,4-trihydroxybenzyl)-2,5-dimethylphenol, 2,6-bis-(4-hydroxybenzyl)-p-cresol, 2,6-bis-(4-hydroxybenzyl)-4-cyclohexylphenol, 2,6-bis-(4-hydroxy-3-methylbenzyl)-p-cresol, 2,6-bis-(4-hydroxy-3,5-dimethylbenzyl)-p-cresol, 2,6-bis-(4-hydroxy-2,5-dimethylbenzyl)-p-cresol, 2,6-bis-(4-hydroxy-3-methylbenzyl)-4-phenylphenol, 2,2',6,6'-tetrakis[(4-hydroxyphenyl)methyl]-4,4'-methylenediphenol, 2,2',6,6'-tetrakis[(4-hydroxy-3-dimethylphenyl)methyl]-4,4'-methylenediphenol, 2,2',6,6'-tetrakis[(4-hydroxy-3-methylphenyl)methyl]-4,4'-methylenediphenol, and 2,2'-bis[(4-hydroxy-3,5-dimethylphenyl)methyl]-6,6'-dimethyl-4,4'-methylenediphenol.

In addition, novolak resins, polyhydroxystyrene resins, acetone-pyrogallol resins and the like can be used.

The esterification reaction for obtaining the aforesaid photosensitive agent is achieved by dissolving prescribed amounts of polyhydroxy compound and 1,2-naphthoquinonediazide-5-(and/or -4-)sulfonyl chloride in a solvent, such as dioxane, acetone, tetrahydrofuran, methyl ethyl ketone, N-methylpyrrolidone, chloroform, trichloroethane, trichloroethylene or dichloroethane, and conducting condensation therein by adding dropwise thereto a basic catalyst, such as sodium hydroxide, sodium carbonate, sodium hydrogen carbonate, triethylamine, N-methylmorpholine, N-methylpiperazine or 4-dimethylaminopyridine. The thus obtained product is washed with water, purified, and then dried.

In a general esterification reaction, the product obtained is a mixture of esterified compounds differing in esterification number and esterified site. However, it is also possible to selectively esterify some particular isomer alone by choosing the reaction condition and the structure of a polyhydroxy compound to be esterified. The term "esterification rate" as used in the present invention refers to the average of esterification rates of the aforesaid mixture.

The esterification rate as defined above can be controlled by properly choosing the ratio between starting materials to be mixed, namely a polyhydroxy compound and 1,2-naphthoquinonediazide-5-(and/or -4-)sulfonyl chloride. More specifically, since substantially all the 1,2-naphthoquinonediazide-5-(and/or -4-)sulfonyl chloride added undergoes the esterification reaction, a mixture having a desired esterification rate can be obtained by adjusting the molar ratio between the starting materials.

The esterification rate appropriate for the present invention is from 30 to 90%, preferably from 40 to 80%. When the esterification rate is less than 30%, the resolution, the defocus latitude and the profile are deteriorated; while when it is more than 90%, the sensitivity is lowered. Both 1,2-naphthoquinonediazide-5-sulfonyl chloride and 1,2-naphthoquinonediazide-4-sulfonyl chloride can be used together, if desired.

The reaction temperature in the foregoing method is generally from −20° C. to 60° C., and preferably from 0° to 40° C.

The photosensitive compounds produced in the manner as described above are used in the form of resinous composition. Therein, they may be used alone or as a mixture of two or more thereof, and therewith the alkali-soluble resin is mixed. As for the mixing proportion, the amount of the photosensitive compound(s) mixed is from 30 to less than 130 parts by weight, preferably from 35 to 90 parts by weight, per 100 parts by weight of novolak resin. When the proportion of the compound(s) mixed is less than 30 parts by weight, sufficient enhancement of sensitivity, resolution, defocus latitude and development latitude, that is, the effects of the present invention, cannot be accomplished; while when it is increased not less than 130 parts by weight, the sensitivity and the profile are deteriorated.

The low molecular weight compound having phenolic hydroxy groups is one of the constituents of the present composition, which includes the compounds in which the number of total carbon atoms per molecule is from 12 to 50 and the number of total phenolic hydroxy groups per molecule is from 2 to 8. Of such compounds, those which, when added to the present novolak resin, can increase the dissolution speed of the novolak resin in alkali are preferred in particular. When the number of total carbon atoms in the aforesaid low molecular weight compound is more than 50, the effects of the present invention are considerably lessened. On the other hand, the compounds containing less than 12 carbon atoms per molecule bring about a new defect of lowering the heat resistance and so on. In order to achieve the effects of the present invention, it is required for the low molecular weight compound to have at least two hydroxyl groups. However, the presence of more than 8 hydroxyl groups therein spoils the effect of improving on the resolution, the defocus latitude and the development latitude.

It is desirable that those low molecular weight compounds be added in a proportion 20 parts by weight or more, and that below 60 parts by weight, preferably from 30 to 55 parts by weight, to 100 parts by weight of the novolak resin. Although the present inventors were previously proposed the positive photoresist composition in which 30 parts by weight of a low molecular weight phenol compound was admixed with a novolak resin having a dispersion degree of from 1.5 to 4.0 (JP-A-4-122938), the addition of a low molecular weight phenol compound as dissolution accelerator in an amount exceeding 30 parts by weight had a defect of causing pattern deformation upon development when the compound was used in combination with the novolak resin as disclosed therein. On the contrary, to our surprise, it has been found that in the combination with the present novolak resin the addition of such a compound in an amount exceeding 20 parts by weight was rather efficient for fully achieving the present effects, and that free from the defect of causing pattern deformation.

In other words, the addition in an amount below 20 parts by weight is insufficient for bringing about the effects intended by the present invention, while the addition in an amount of not less than 60 parts by weight causes a problem of lowering the heat resistance.

As for the low molecular weight compound used in the present invention, any compounds can bring about the intended effects so far as they can satisfy the aforementioned structural requirements.

Suitable examples of the polyhydroxy compound as defined above include 2,3,4-trihydroxybenzophenone, 2,3, 4,4'-tetrahydroxybenzophenone, 2,3,4,3',4',5'-hexahydroxybenzophenone, acetone-pyrogallol condensed resin, phloroglucide, 2,4,2',4'-tetrahydroxybiphenyl, 4,4'-thiobis(1,3-dihydroxy)benzene, 2,2',4,4'-tetrahydroxydiphenyl ether, 2,2',4,4'-tetrahydroxydiphenyl sulfoxide, 2,2',4,4'-tetrahydroxydiphenyl sulfone, tris(4-hydroxyphenyl)methane, 1,1-bis(4-hydroxyphenyl) cyclohexane, 4,4'-(α-methylbenzylidene)bisphenol, α,α', α"-tris(4-hydroxyphenyl)-1,3,5-triisopropylbenzene, α,α', α"-tris(4-hydroxyphenyl)-1-ethyl-4-isopropylbenzene, 1,2, 2-tris(hydroxyphenyl)propane, 1,1,2-tris(3,5-dimethyl-4-hydroxyphenyl)propane, 2,2,5,5-tetrakis(4-hydroxyphenyl) hexane, 1,1,2,2-tetrakis(4-hydroxyphenyl)ethane, 1,1,3-tris (hydroxyphenyl)butane and para[α,α,α',α'-tetrakis(4-hydroxyphenyl)]xylene. In addition, polyhydroxy compounds functioning as intermediary materials (skeletons) of the aforementioned photosensitive agent (skeleton) can also be employed.

Examples of a solvent which can be used for dissolving the present alkali-soluble novolak resin, photosensitive agent and dissolution accelerator include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methylether acetate, propylene glycol propylether acetate, propylene glycol monomethylether propionate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl β-methoxyisobutyrate, methyl α-hydroxyisobutyrate, methyl pyruvate, ethyl pyruvate, ethyl acetate, and butyl acetate. These organic solvents are used alone or as a mixture of two or more thereof.

Also, such an organic solvent as cited above can be used as a mixture with a high boiling point solvent, such as N-methylformamide, N,N-dimethylformamide, N-methylacetamide, N,N-dimethylacetamide, N-methylpyrrolidone, dimethyl sulfoxide and benzyl ethyl ether.

Into the present positive photoresist composition, a surfactant can be blended in order to improve upon coating properties, such as striation.

As examples of a surfactant which can be used for the aforesaid purpose, mention may be made of nonionic surfactants including polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenyl ether and polyoxyethylene nonyl phenyl ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate: fluorine-containing surfactants, such as Eftop EF 301, EF303 and EF352 (commercial names, produced by Shin Akita Kasei Co., Ltd.), Megafac F171 and F173 (commercial names, produced by Dainippon Ink & Chemicals, Inc.), Florad FC430 and FC431 (commercial names, produced by Sumitomo 3M), and Asahi Guard AG710, Surflon S-382, SC101, SC102, SC103, SC104, SC105 and SC106 (commercial names, produced by Asahi Glass Company Ltd.): organosiloxane polymers, such as KP341 (code name, produced by Shin-Etsu Chemical Industry Co., Ltd.): and acrylic acid or methacrylic acid (co)polymers, such as Polyflow No. 75 and No. 95 (commercial name, produced by Kyoeisha Yushi Kagaku Kogyo K.K.). Such a surfactant as cited above is generally blended in a proportion of no greater than 2 parts by weight, preferably no greater than 1 part by weight, to 100 parts by weight of the alkali-soluble resin in the present composition.

Those surfactants may be added alone or as a mixture of some of them.

The developing solutions which can be used for the present positive photoresist composition are water solutions of alkalis, including inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide and choline, and cyclic amines such as pyrrole and piperidine. Also, the water solutions of those alkalis can be admixed with appropriate amounts of an alcohol, such as isopropyl alcohol, and a surfactant of, e.g., nonionic type.

In the present positive photoresist composition, a light absorbent, a cross-linking agent, an adhesion assistant and so on can be blended, if desired. The light absorbent is added for the purpose of inhibiting halation from a substrate or enhancing perceptibility when the photoresist composition is coated on a transparent substrate, if needed. Suitable examples of such a light absorbent include commercially available ones as described, e.g., in *Kogyo-yo Shikiso no Gijutsu to Shijo* (which means "Arts and Market of Industrial Dyes") published by CMC Shuppan, and *Senryo Binran* (which means "Handbook of Dyes") compiled by Yuki Gosei Kagaku Kyokai, such as C.I. Disperse Yellow 1, 3, 4, 5, 7, 8, 13, 23, 31, 49, 50, 51, 54, 56, 60, 64, 66, 68, 79, 82, 88, 90, 93, 102, 114 and 124, C.I. Disperse Orange 1, 5, 13, 25, 29, 30, 31, 44, 57, 72 and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 165, C.I. Solvent Yellow 14, 16, 33 and 56, C.I. Solvent Orange 2 and 45, C.I. Solvent Red 1, 3, 8, 23, 24, 25, 27 and 49, C.I. Pigment Green 10, and C.I. Pigment Brown 2. The light absorbent as recited above is generally blended in a proportion of no greater than 100 parts by weight, preferably no greater than 50 parts by weight, and more preferably no greater than 30 parts by weight, to 100 parts by weight of the alkali-soluble resin.

So far as it has no significant influence upon the formation of positive images, a cross-linking agent can be added. The addition of a cross-linking agent is intended mainly for adjustment of sensitivity and improvements in heat resistance and dry etching resistance.

As examples of a cross-linking agent which can be used, mention may be made of compounds obtained by acting formaldehyde on melamine, benzoguanamine, glycoluril and the like, alkyl-modified compounds thereof, epoxy compounds, aldehydes, azide compounds, organic peroxides, and hexamethylenetetramine. These cross-linking agents can be blended in a proportion of less than 10 parts by weight, preferably less than 5 parts by weight, to 100 parts by weight of the photosensitive agent. When the amount of a cross-linking agent blended is increased beyond 10 parts by weight, undesirable things including a drop in sensitivity and generation of scum (resist residue) are caused.

An adhesion assistant is added for the purpose of heightening the adhesiveness of the resist to a substrate, thereby preventing the resist from peeling off, particularly in an etching step. Specific examples thereof include chlorosilanes, such as trimethylchlorosilane, dimethylvinylchlorosilane, methyldiphenylchlorosilane and chloromethyldimethylchlorosilane; alkoxysilanes, such as trimethylmethoxysilane, dimethyldiethoxysilane, methyldimethoxysilane, dimethylvinylethoxysilane, diphenyldimethoxysilane and phenyltriethoxysilane; silazanes, such as hexamethyldisilazane, N,N'-bis(trimethylsilyl)urea, dimethyltrimethylsilylamine and trimethylsilylimidazole; silanes, such as vinyltrichlorosilane, γ-chloropropyltrimethoxysilane, γ-aminopropyltriethoxysilane and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole and mercaptopyrimidine; and urea compounds, such as 1,1-dimethylurea and 1,3-dimethylurea, or thiourea compounds.

These adhesion assistants are blended in a proportion of, in general, less than 10 parts by weight, preferably less than 5 parts by weight, to 100 parts by weight of the alkali-soluble resin.

The present positive photoresist composition as mentioned above is coated on a substrate suitable for production of precision integrated circuit elements (e.g., a transparent substrate such as silicon/silicon dioxide-coated glass substrate and ITO substrate) by an appropriate coating method, such as a spin coating method, a roll coating method, a flow coating method, a dip coating method, a spray coating method, or a doctor coating method. The thus coated composition is subjected successively to prebake, exposure to light via a desired mask, PEB (PEB: Post Exposure Bake) if needed, development, rinsing and drying to provide a satisfactory resist.

The present invention will now be illustrated in more detail by reference to the following examples, but it should be understood that these examples are not to be construed as limiting the scope of the invention in any way.

SYNTHESIS EXAMPLE 1

Synthesis of Novolak Resin A (Present Resin)

| Thymol      | 30.34 g (0.20 mole) |
|-------------|---------------------|
| 2,3-Xylenol | 97.74 g (0.80 mole) |

The ingredients described above, 85.22 g of a 37% water solution of formaldehyde, 2.52 g of oxalic acid dihydrate and 20.00 g of ethyl 3-ethoxypropionate were placed in a three-necked flask, and heated to 130° C. with stirring for 12 hours to undergo reaction. Thereto, 20.00 g of ethyl 3-ethoxypropionate was further added. Then, the reaction system was heated up to 200° C., whereby the formaldehyde and monomers remaining unreacted and the water were distilled away. The time taken to conclude the distillation was 3 hours. Thereafter, the reaction system was lowered to 180° C., and thereinto 250 g of ethyl 2-hydroxypropionate was gradually dripped to make a homogenous solution. The solution was cooled to room temperature, and therefrom a product was taken out. The thus obtained novolak resin A had a weight-average molecular weigh of 3070 (reduced to a polystyrene basis). The dispersion degree thereof was 2.0.

SYNTHESIS EXAMPLE 2

Syntheses of Novolak Resins B to J (Present Resins)

Novolak resins B to J were each synthesized in the same manner as in the aforementioned Synthesis Example 1, except that the monomer species and their respective amounts (mole %) used for the condensation reaction with formaldehyde were changed to those set forth in Table 1.

SYNTHESIS EXAMPLE 3

Synthesis of Novolak Resin K (Present Resin)

| Thymol                                      | 75.11 g  |
|---------------------------------------------|----------|
| 2,3-Xylenol                                 | 198.53 g |
| 2,6-Xylenol                                 | 24.43 g  |
| 2,2'-Dihydroxy-5,5'-dimethyldiphenylmethane | 14.27 g  |
| o-Cresol                                    | 5.41 g   |

The ingredients described above, 231.83 g of a 37.10% water solution of formaldehyde, 9.46 g of oxalic acid dihydrate and 50.00 g of ethyl 3-ethoxypropionate were placed in a three-necked flask, and made to react with one another by heating to 130° C. with stirring for 12 hours. Thereto, 25.00 g of ethyl 3-ethoxypropionate was further added, and the reaction was continued for 5 hours. Again, 25.00 g of ethyl 3-ethoxypropionate was added, and then the reaction system was heated up to 200° C. By this heating operation, the formaldehyde and monomers remaining unreacted and the water were distilled away. The time taken to conclude the distillation was 3 hours. Thereafter, the reaction system was lowered to 180° C., and thereinto 600 g of ethyl 2-hydroxypropionate was gradually dripped to make a homogenous solution. The solution was cooled to room temperature, and therefrom a product was taken out. The thus obtained novolak resin k had a weight-average molecular weight of 3430 (reduced to a polystyrene basis). The dispersion degree thereof was 2.0.

SYNTHESIS EXAMPLE 4

Syntheses of Novolak Resins a to e (Comparative Resins)

Novolak resins a to e were each synthesized in the same manner as in the aforementioned Synthesis Example 1, except that the monomer species and their respective amounts (mole %) used for the condensation reaction with formaldehyde were changed to those set forth in Table 1.

TABLE 1

| Novolak Resin | Monomer Composition | Amount used (by mole) | Mw | Dispersion degree |
|---|---|---|---|---|
| B | thymol/2,3-xylenol/o-cresol | 0.2/0.6/0.2 | 3470 | 2.2 |
| C | thymol/2,5-xylenol | 0.2/0.8 | 2940 | 1.9 |
| D | thymol/2,5-xylenol/2,6-xylenol | 0.2/0.7/0.1 | 2850 | 1.7 |
| E | isothymol/2,3-xylenol | 0.2/0.8 | 3080 | 2.0 |
| F | isothymol/2,5-xylenol/2,6-xylenol | 0.2/0.7/0.1 | 2910 | 1.9 |
| G | thymol/2,3-xylenol/p-cresol | 0.2/0.7/0.1 | 3760 | 2.3 |
| H | thymol/2,5-xylenol/3,4-xylenol | 0.1/0.8/0.1 | 2800 | 2.0 |
| I | thymol/2,3-xylenol/o-cresol | 0.3/0.5/0.2 | 3170 | 2.2 |
| J | thymol/2,3-xylenol/2,3,5-trimethylphenol | 0.2/0.7/0.1 | 2520 | 1.8 |
| a | thymol/m-cresol | 0.1/0.9 | 6910 | 5.5 |
| b | thymol/m-cresol/p-cresol | 0.1/0.4/0.5 | 7340 | 6.1 |
| c | thymol/m-cresol/2,3-xylenol | 0.2/0.4/0.4 | 5130 | 5.0 |
| d | thymol/1-naphthol | 0.2/0.8 | 2140 | 1.7 |
| e | isothymol/1-naphthol/2,3-xylenol | 0.2/0.4/0.4 | 2460 | 1.8 |

Syntheses of Photosensitive Materials (i) Synthesis of photosensitive material (S-1);

In a three-necked flask, 62.9 g of Compound (1) illustrated in Table 2, 53.7 g of 1,2-naphthoquinonediazide-5-sulfonyl chloride and 800 ml of acetone were placed, and mixed homogeneously to make a solution. Then, 21.2 g of triethylamine was slowly dropped into the solution, and therein the reaction was run for 3 hours at 25° C. The reaction mixture thus obtained was poured into 3,000 ml of a 1% water solution of hydrogen chloride. The precipitates thus produced were filtered off, washed with water and dried to give the intended photosensitive material (S-1).

(ii) Synthesis of photosensitive material (S-2);

In a three-necked flask, 53.8 g of Compound (2) illustrated in Table 2, 53.7 g of 1,2-naphthoquinonediazide-5-sulfonyl chloride and 800 ml of acetone were placed, and mixed homogeneously to make a solution. Then, 21.2 g of triethylamine was slowly dropped into the solution, and therein the reaction was run for 3 hours at 25° C. The reaction mixture thus obtained was poured into 3,000 ml of a 1% water solution of hydrogen chloride. The precipitates thus-produced were filtered off, washed with water and dried to give the intended photosensitive material (S-2).

(iii) Synthesis of photosensitive material (S-3);

In a three-necked flask, 56.5 g of Compound (3) illustrated in Table 2, 53.7 g of 1,2-naphthoquinonediazide-5-sulfonyl chloride and 800 ml of acetone were placed, and mixed homogeneously to make a solution. Then, 21.2 g of triethylamine was slowly dropped into the solution, and therein the reaction was run for 3 hours at 25° C. The reaction mixture thus obtained was poured into 3,000 ml of a 1% water solution of hydrogen chloride. The precipitates thus produced were filtered off, washed with water and dried to give the intended photosensitive material (S-3).

TABLE 2

Compounds as Mother Nuclei of Photosensitive Materials

Compound (1)

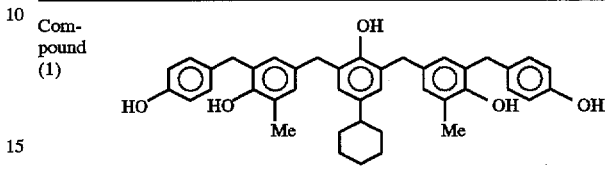

TABLE 2-continued

Compounds as Mother Nuclei of Photosensitive Materials

Compound (2)

Compound (3)

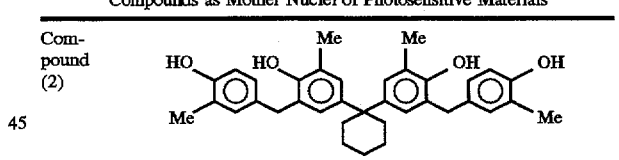
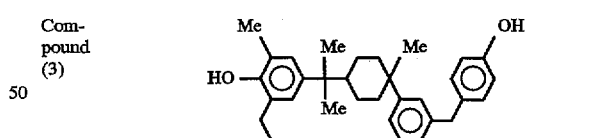

Preparation and Evaluation of Positive Photoresist Compositions

Photoresist compositions (Examples 1 to 11 and Comparative Examples 1 to 5) were each prepared as follows:

One novolak resin selected from the foregoing novolak resins A to K and a to e, the foregoing photosensitive material (S-1), (S-2) or (S-3) and a polyhydroxy compound (P-1), (P-2) or (P-3) illustrated in Table 3 were mixed in their respective proportions set forth in Table 4, and thereto was added ethyl 2-hydroxypropionate in such an amount as to adjust the total solids concentration to 25%. After the resultant mixture was made into a homogeneous solution, the solution was passed through a microfilter having a pore size of 0.10 μm. Each photoresist composition thus prepared was coated on a silicon wafer by means of a spinner, and dried at 90° C. for 60 seconds with a vacuum contact hot plate, thereby forming a resist film having a thickness of 0.99 μm.

TABLE 3

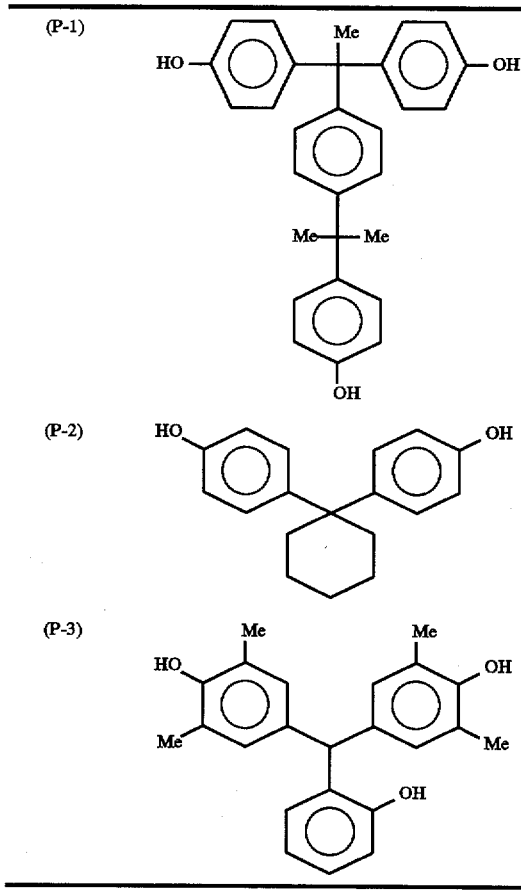

Polyhydroxy Compounds (P-1)

(P-2)

(P-3)

TABLE 4

| | Novolak Resin | | Photosensitive Material | | Polyhydroxy Compound | |
|---|---|---|---|---|---|---|
| | species | Amount added* | species | Amount added* | species | Amount added* |
| Example 1 | A | 100 | S-1 | 70 | P-2 | 40 |
| Example 2 | B | 100 | S-2 | 80 | P-3 | 50 |
| Example 3 | C | 100 | S-3 | 60 | P-1 | 30 |
| Example 4 | D | 100 | S-1 | 95 | P-2 | 50 |
| Example 5 | E | 100 | S-2 | 70 | P-3 | 35 |
| Example 6 | F | 100 | S-3 | 70 | P-1 | 40 |
| Example 7 | G | 100 | S-1 | 60 | P-2 | 35 |
| Example 8 | H | 100 | S-2 | 90 | P-3 | 40 |
| Example 9 | I | 100 | S-3 | 70 | P-1 | 50 |
| Example 10 | J | 100 | S-1 | 70 | P-2 | 35 |
| Example 11 | K | 100 | S-2 | 80 | P-3 | 40 |
| Comparative Example 1 | a | 100 | S-1 | 70 | P-2 | 40 |
| Comparative Example 2 | b | 100 | S-2 | 80 | P-3 | 40 |

TABLE 4-continued

| | Novolak Resin | | Photosensitive Material | | Polyhydroxy Compound | |
|---|---|---|---|---|---|---|
| | species | Amount added* | species | Amount added* | species | Amount added* |
| Comparative Example 3 | c | 100 | S-3 | 60 | P-1 | 40 |
| Comparative Example 4 | d | 100 | S-1 | 95 | P-2 | 40 |
| Comparative Example 5 | e | 100 | S-2 | 70 | P-3 | 40 |

*: unit: parts by weight

Each resist film was exposed to light by means of a reducing projection exposure apparatus (Model NSR-2005i9C, made by Nikon), subjected to PEB at 115° C. for 60 seconds, developed for 1 minute with a 2.38% of water solution of tetramethylammonium hydroxide, washed with water for 30 seconds, and then dried.

Each resist pattern thus obtained on the silicon wafer was observed under a scanning electron microscope, and thereby the resist performance was evaluated. The evaluation results are shown in Tables 5.

In the evaluation, the sensitivity is defined as the reciprocal of the exposure amount required for reproducing a 0.5 μm mask pattern, and shown as relative value, with the resist of Comparative Example 1 being taken as 1.0.

The resolution was expressed as the limiting resolving power under the exposure for reproducing a 0.50 μm mask pattern.

The defocus latitude was evaluated by performing profile observation under a scanning electron microscope in order to determine a focus range in which a 0.50 μm resist pattern was resolved without a decrease in film thickness under the effective speed.

The heat resistance was represented by the temperature of a vacuum contact hot plate at which it is possible to bake a resist pattern formed on a silicon wafer for 4 minutes without causing any pattern deformation.

The resist pattern shape is represented by an angle (θ) which the resist wall in the vertical section of a 0.50 μm resist pattern forms with the silicon wafer plane.

The development scum is represented by the extent of scum generated upon the formation of a 0.50 μm resist pattern. The case of generating no scum is represented by A, the case of generating some extent of scum by B, and the case of generating a good deal of scum by C.

The development latitude was examined by employing two different development times, namely 40 seconds and 90 seconds. The ratio between the sensitivities achieved under these different development conditions is adopted as the indication of the development latitude. Accordingly, the development latitude is wider, that is, more desirable, the more closely the ratio approaches 1.0.

TABLE 5

| Photoresist Composition | Relative Sensitivity | Resolution (μm) | Heat Resistance (°C.) | Resist Profile (θ) | Defocus Latitude | Development Latitude | Development Scum |
|---|---|---|---|---|---|---|---|
| Example 1 | 1.2 | 0.29 | 155 | 89 | 1.8 | 0.84 | A |
| Example 2 | 1.3 | 0.29 | 160 | 89 | 1.8 | 0.88 | A |
| Example 3 | 1.2 | 0.29 | 155 | 88 | 2.0 | 0.88 | A |
| Example 4 | 1.2 | 0.28 | 155 | 89 | 1.8 | 0.84 | A |
| Example 5 | 1.3 | 0.29 | 150 | 89 | 1.8 | 0.84 | A |
| Example 6 | 1.2 | 0.29 | 160 | 89 | 2.0 | 0.84 | A |
| Example 7 | 1.3 | 0.28 | 155 | 89 | 2.0 | 0.85 | A |
| Example 8 | 1.2 | 0.29 | 160 | 89 | 1.8 | 0.86 | A |
| Example 9 | 1.2 | 0.29 | 155 | 89 | 1.8 | 0.88 | A |
| Example 10 | 1.2 | 0.29 | 160 | 89 | 2.0 | 0.88 | A |
| Example 11 | 1.3 | 0.28 | 155 | 89 | 2.2 | 0.88 | A |
| Compar. Ex. 1 | 1.0 | 0.40 | 145 | 87 | 0.4 | 0.50 | C |
| Compar. Ex. 2 | 1.0 | 0.35 | 145 | 87 | 0.4 | 0.60 | C |
| Compar. Ex. 3 | 0.9 | 0.35 | 140 | 87 | 0.8 | 0.55 | B |
| Compar. Ex. 4 | 0.6 | 0.45 | 145 | 86 | 0.4 | 0.60 | C |
| Compar. Ex. 5 | 0.6 | 0.45 | 145 | 87 | 1.2 | 0.65 | C |

As can be seen from Table 5, the present resist compositions prepared in Examples 1 to 11 were superior in all the resist performances, namely the sensitivity, the resolution, the heat resistance, the resist shape, the defocus latitude, the development latitude and the development scum, to those prepared in Comparative Examples 1 to 5.

In accordance with the present invention, the positive photoresist composition obtained has high sensitivity, high resolution, wide defocus and development latitudes, less development scum, good resist shape, and high heat resistance.

While the invention has been described in detail and with reference to specific embodiments thereof, it will be apparent to one skilled in the art that various changes and modifications can be made therein without departing from the spirit and scope thereof.

What is claimed is:

1. A positive photoresist composition comprising:

(A) 100 parts by weight of an alkali-soluble resin prepared by condensation of aldehydes and a phenol compound mixture which comprises (i) thymol, isothymol or a thymol-isothymol mixture, and (ii) one or more of a phenol compound represented by the following formula (I);

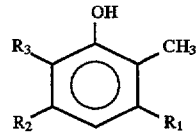

wherein $R_1$, $R_2$ and $R_3$ are the same or different, and each of them represents a hydrogen atom or a methyl group, and optionally, as a third monomer, (iii) a phenol compound other than m-cresol;

(B) from 30 to less than 130 parts by weight of 1,2-naphthoquinonediazide-5-(and/or -4-)sulfonic acid esters as photosensitive agent; and (C) from 20 to less than 60 parts by weight of a low molecular weight compound which contains from 12 to 50 carbon atoms in all and has from 2 to 8 phenolic hydroxy groups.

2. The positive photoresist composition as in claim 1, wherein said third monomer is a monofunctional or bifunctional phenol compound.

3. The positive photoresist composition comprising:

(A) 100 parts by weight of an alkali-soluble resin prepared by condensation of aldehydes and a phenol compound mixture which comprises (i) thymol, isothymol or a thymol-isothymol mixture, (ii) one or more of a phenol compound represented by the following formula (I);

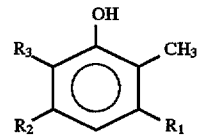

wherein $R_1$, $R_2$ and $R_3$ are the same or different, and each of them represents a hydrogen atom or a methyl group, and as a third monomer, (iii) at least one phenol compound selected from the group consisting of p-cresol, 3,4-xylenol and phenol compounds represented by the following formula (II);

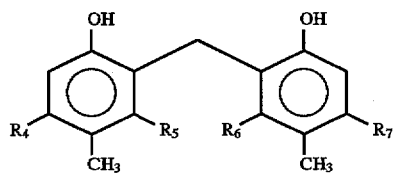

wherein $R_4$, $R_5$, $R_6$ and $R_7$ are the same or different, and each of them represents a hydrogen atom or a methyl group;

(B) from 30 to less than 130 parts by weight of 1,2-naphthoquinonediazide-5-(and/or -4-)sulfonic acid esters as photosensitive agent; and (C) from 20 to less than 60 parts by weight of a low molecular weight compound which contains from 12 to 50 carbon atoms in all and has from 2 to 8 phenolic hydroxy groups.

4. The positive photoresist composition as in claim 2, wherein said third monomer is selected from the group consisting of o-methoxyphenol, o-ethylphenol, p-ethylphenol, 2-methoxy-4-methylphenol, o-propoxyphenol, p-propoxyphenol, o-butoxyphenol, p-butoxyphenol, 3,4,5-trimethylphenol, o-vinylphenol, p-vinylphenol, o-allylphenol, p-allylphenol, o-phenylphenol, p-phenylphenol, o-benzylphenol, p-benzylphenol, o-methoxycarbonylphenol, p-methoxycarbonylphenol, o-benzoyloxyphenol, p-benzoyloxyphenol, o-chlorophenol, p-chlorophenol, o-cyclohexylphenol, p-cyclohexylphenol, 3-methyl-6-cyclohexylphenol, and polyhydroxybenzenes.

5. The positive photoresist composition as in claim 1, wherein the proportion of the thymol, isothymol, or a mixture thereof in the phenol compound mixture is from 10 to 70 mole % and the proportion of the phenol compound represented by formula (I) in the phenol compound mixture is from 30 to 90 mole %.

6. The positive photoresist composition as in claim 3, wherein the proportion of the phenol compound as the third monomer is in the range of 0.2 to 20 mole % to the total phenol monomers.

7. The positive photoresist composition as in claim 1, wherein the ratio of aldehydes to the phenol compound mixture is from 0.4 to 1.5 by mole.

8. The positive photoresist composition as in claim 3, wherein the ratio of aldehydes to the phenol compound mixture is from 0.4 to 1.5 by mole.

9. The positive photoresist composition as in claim 1, wherein said alkali-soluble resin has a dispersion degree of from 1.5 to 4.0.

10. The positive photoresist composition as in claim 3, wherein said alkali-soluble resin has a dispersion degree of from 1.5 to 4.0.

11. The positive photoresist composition as in claim 1, wherein said alkali-soluble resin has a weight-average molecular weight of from 2,000 to 20,000.

12. The positive photoresist composition as in claim 3, wherein said alkali-soluble resin has a weight-average molecular weight of from 2,000 to 20,000.

* * * * *